United States Patent
Ozanne et al.

(10) Patent No.: US 9,478,686 B2
(45) Date of Patent: Oct. 25, 2016

(54) METHOD FOR PRODUCING A PHOTOVOLTAIC CELL HAVING A HETEROJUNCTION, AND RESULTING PHOTOVOLTAIC CELL

(71) Applicant: COMMISSARIAT A L'ENERGIE ATOMIQUE ET AUX ENERGIES ALTERNATIVES, Paris (FR)

(72) Inventors: Anne-Sophie Ozanne, Allevard (FR); Maria-Delfina Munoz, Saint Christophe sur Guiers (FR); Nathalie Nguyen, Les Marches (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/429,654

(22) PCT Filed: Sep. 23, 2013

(86) PCT No.: PCT/FR2013/000250
§ 371 (c)(1),
(2) Date: Mar. 19, 2015

(87) PCT Pub. No.: WO2014/044933
PCT Pub. Date: Mar. 27, 2014

(65) Prior Publication Data
US 2015/0280030 A1    Oct. 1, 2015

(30) Foreign Application Priority Data
Sep. 24, 2012  (FR) .................... 12 02533

(51) Int. Cl.
*H01L 31/0256*  (2006.01)
*H01L 31/0376*  (2006.01)
(Continued)

(52) U.S. Cl.
CPC ......... *H01L 31/0376* (2013.01); *H01L 31/074* (2013.01); *H01L 31/0747* (2013.01); *H01L 31/208* (2013.01); *Y02E 10/50* (2013.01)

(58) Field of Classification Search
CPC .............. H01L 31/00; H01L 31/0216; H01L 31/02161; H01L 31/0248; H01L 31/0256; H01L 31/0264; H01L 31/028; H01L 31/0284; H01L 31/032; H01L 31/036; H01L 31/0376; H01L 31/03762; H01L 31/037
See application file for complete search history.

(56) References Cited

U.S. PATENT DOCUMENTS 7,787,564 B1    8/2010  Anvari
2011/0297227 A1  12/2011  Pysch et al.
(Continued)

FOREIGN PATENT DOCUMENTS

DE   10 2010 030 696 A1   1/2012
EP      1 187 223 A2      3/2002
(Continued)

OTHER PUBLICATIONS

Baron et al., "Electrical Behavior of Group III and V Implanted Dopants in Silicon," Journal of Applied Physics, vol. 40, pp. 3702-3719, 1969.
(Continued)

*Primary Examiner* — Zandra Smith
*Assistant Examiner* — Evan Clinton
(74) *Attorney, Agent, or Firm* — Oliff PLC

(57) ABSTRACT

A method for producing a heterojunction solar cell including the following successive steps: providing a substrate made from crystalline semiconductor material, doped with a first type of doping, and provided with a first main face; depositing a first layer of intrinsic amorphous semiconductor material on said first main face of the substrate; and forming a second layer of amorphous semiconductor material on the first layer. The method includes deposition of a barrier layer between the first and second layers, said barrier layer being of different nature from those of the first and second layers and includes doping of the second layer by ion implantation.

10 Claims, 3 Drawing Sheets

(51) Int. Cl.
  *H01L 31/0747* (2012.01)
  *H01L 31/074* (2012.01)
  *H01L 31/20* (2006.01)

(56) References Cited

U.S. PATENT DOCUMENTS

2012/0015474 A1   1/2012  Wu et al.
2012/0279562 A1*  11/2012 Yang ................ H01L 31/02244
                                                        136/255

FOREIGN PATENT DOCUMENTS

| EP | 1 643 564 A2 | 4/2006 |
| FR | 2 955 702 A1 | 7/2011 |
| JP | 57043477 A * | 3/1982 |
| WO | 2011/078521 A2 | 6/2011 |

OTHER PUBLICATIONS

Douglas et al., "A Study of the Factors which Control the Efficiency of Ion-Implanted Silicon Solar Cells," IEEE Transactions on Electron Devices, vol. 27, No. 4, pp. 792-802, 1980.

Minnucci et al., "Tailored Emitter, Low-Resistivity, Ion-Implanted Silicon Solar Cells," IEEE Transactions on Electron Devices, vol. 27, No. 4, pp. 802-806, 1980.

Gibbons, James F., "Ion Implantation in Semiconductors—Part I Range Distribution Theory and Experiments," Proceedings of the IEEE, vol. 56, No. 3, pp. 295-319, 1968.

* cited by examiner

METHOD FOR PRODUCING A PHOTOVOLTAIC CELL HAVING A HETEROJUNCTION, AND RESULTING PHOTOVOLTAIC CELL

BACKGROUND OF THE INVENTION

The invention relates to a method for producing a heterojunction solar cell and to a solar cell obtained in this way.

STATE OF THE ART

A solar cell can be formed by a multilayer stack, in the majority of cases comprising semiconductor materials such as silicon, and enabling the received photons to be converted directly into an electric signal.

As represented in FIG. 1, conventionally a heterojunction solar cell successively comprises:
- a substrate 1, made from crystalline silicon, of a predefined n-type or p-type (also noted (n) c-Si or (p) c-Si depending on the nature of the doping),
- a first layer 2 made from non-intentionally doped amorphous silicon, also called intrinsic amorphous silicon and able to be noted (i) a-Si or (i) a-Si: H), to passivate the surface of the substrate, said layer being called passivation layer 2,
- a second layer 3 made from amorphous silicon of a second p-type or n-type opposite type to that of substrate 1, and able to be noted (p) a-Si (or (p) a-Si: H) or (n) a-Si (or (n) a-Si: H), depending on the nature of the doping),
- possibly an anti-reflection layer (not represented in FIG. 1),
- and electric contacts (not represented in FIG. 1).

To form second layer 3, two techniques are commonly used. The first technique consists in depositing a layer of amorphous silicon by plasma enhanced chemical vapor deposition (PECVD) and in performing doping by input of a doping gas during the PECVD. The second technique consists in performing ion implantation to dope an intrinsic amorphous silicon layer deposited beforehand on substrate 1.

Doping of the semiconductor materials by ion implantation is a method that has been known for a long time. The document "Electrical Behavior of Group III and V Implanted Dopants in Silicon" by Baron et al. (Journal of Applied Physics (1969), 40, 3702) describes for example the behavior of silicon substrates doped by different group III and V elements by ion implantation.

This ion implantation method can be applied to producing semiconductor devices comprising junction transistors, as described in U.S. Pat. No. 7,787,564. A N-doped germanium substrate is bombarded by a beam of ions containing boron to form a P-doped area in the substrate. The substrate is then annealed at temperatures of about 400° C. to repair the damage caused by the beam.

Patent application WO-A-2011/078521 describes for example a solar cell with a silicon heterojunction of BSF (back surface field) type and the fabrication method thereof implementing dopings by ion implantation.

In like manner, the articles "A study of the Factors which Control the Efficiency of Ion-Implanted Silicon Solar Cells" by Douglas et al. (IEEE Transactions on Electron Devices (1980), 27, 4, 792-802) and "Tailored Emitter, Low-Resistivity, Ion-Implanted Silicon Solar Cells" by Minnucci et al. (IEEE Transactions on Electron Devices (1980), 27, 4, 802-806) describe different silicon solar cells the fabrication method of which comprises a doping step by ion implantation. After ion implantation, the substrates are annealed at temperatures of more than 500° C. These documents show that a large number of parameters used when producing solar cells have an influence on the performances of the cells. These parameters are for example the implantation energy, the nature of the species used during implantation, the dopant concentration, the orientation of the substrate, the resistivity of the substrate, and so forth.

The documents "Electrical Behavior of Group III and V Implanted Dopants in Silicon" by Baron et al. (Journal of Applied Physics (1969), 40, 3702) and "Ion Implantation in Semiconductors—Part I Range Distribution Theory and Experiments" by Gibbons (Proceedings of the IEEE (1968), 56, 3, 295-319) confirm that the ion implantation processes are very complex and that the implantation profiles are very difficult as they depend greatly on the experimental conditions: temperature, nature of the ions to be implanted, orientation of the beam, crystalline structure of the material to be doped, and so forth.

In addition, as the layers to be doped generally present small thicknesses, it is particularly difficult to control the profile of the ion implantation precisely.

To obtain the required implantation profile in a semiconductor material, it is therefore generally necessary to test the implantation parameters experimentally, which requires numerous tedious and costly tests.

OBJECT OF THE INVENTION

The object of the invention is to remedy the shortcomings of prior art, and in particular to propose a method for producing a heterojunction solar cell that is simple, easy to implement, robust and reproducible. More particularly, the object of the invention is to enable doping by ion implantation of at least one of the thin layers of the solar cell to be performed in controlled and efficient manner in order to enhance the performances of the solar cell.

This object tends to be achieved by the appended claims.

BRIEF DESCRIPTION OF THE DRAWINGS

Other advantages and features will become more clearly apparent from the following description of particular embodiments of the invention given for non-restrictive example purposes only and represented in the appended drawings, in which.

Identical, similar or equivalent parts of the different figures described in the following bear the same reference numerals so as to facilitate switching from one figure to the other.

The different parts represented in the figures are not necessarily represented on a uniform scale in order to make the figures more legible.

DESCRIPTION OF A PREFERRED EMBODIMENT OF THE INVENTION

Figure 1:
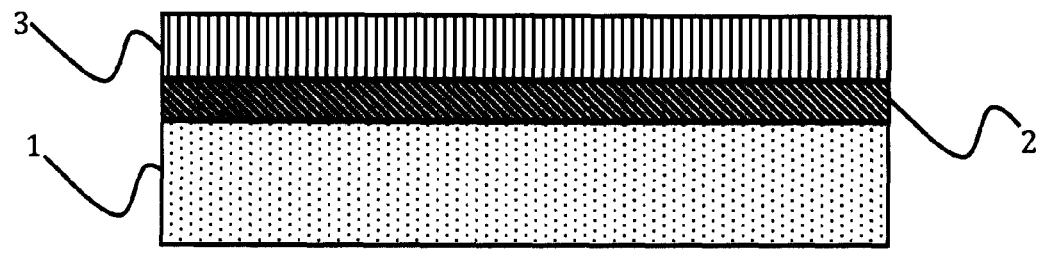
FIG. 1 represents a solar cell according to the prior art, in schematic manner and in cross-section, FIGS. 2 and 3 respectively represent, in schematic manner and in cross-section, a step of the production method according to a first embodiment and the solar cell obtained in this way, FIGS. 4 and 5 respectively represent, in schematic manner and in cross-section, a step of the production method according to a first embodiment and the solar cell obtained in this way, FIGS. 6 and 7 respectively represent, in schematic manner and in cross-section, a step of the production method according to a first embodiment and the solar cell obtained in this way.
Figure 2:
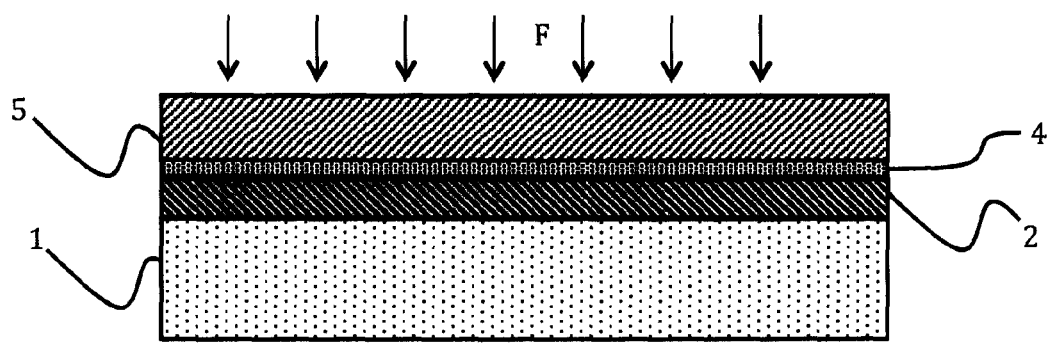
Figure 3:
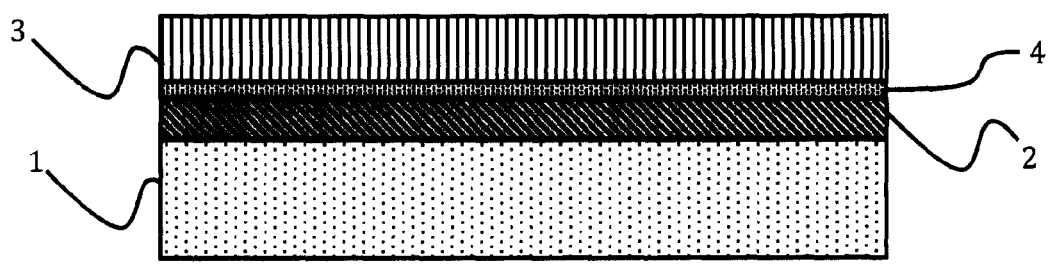

As represented in FIGS. 2 and 3, a heterojunction solar cell is obtained by forming the second layer 3 by doping by ion implantation (the arrows F schematically represent the direction of ion implantation) of a previously deposited and initially non-doped (i.e. made from intrinsic amorphous silicon) or not sufficiently doped amorphous silicon layer 5.

It should be recalled that doping by ion implantation consists in introducing electrically active dopant agents, in particular in the form of ions, into a semiconductor material and in particular into silicon, so as to locally modify the electric conductivity of the semiconductor material. The dopant agents used for doping are for example boron or phosphorus. Aluminium or gallium can also be used. The implanted dopant agents and/or the dopant agent content are conventionally chosen according to the type of doping that is required to be given to the semiconductor material. Performing doping by ion implantation advantageously enables the quantity of implanted dopant agents to be controlled and the semiconductor material to be selectively (locally) doped. It is thus possible to define localised patterns with different doping levels.

Furthermore, as illustrated in FIGS. 2 and 3, a barrier layer 4 is formed on first layer 2 before formation of layer 5. Placing a barrier layer 4 between layers 2 and 5 does in fact prevent penetration of the ions into first layer 2 and into crystalline substrate 1 during the ion implantation doping step. These layers are then not contaminated when the ion implantation doping is performed and the performances of the cell are thereby improved.

Thus, in an advantageous embodiment, substrate 1 is preferentially made from crystalline silicon which is for example N-doped. It comprises two main faces: the front side and the back side. The front side is in general formed by the face of the substrate on which a stack of thin layers designed to be directly exposed to the incident radiation is arranged whereas the back side is the opposite face of the substrate.

First layer 2, deposited on the front side of substrate 1, is an intrinsic amorphous silicon layer also called passivation layer. It enables the surface of the substrate to be passivated, i.e. it limits recombination of the charge carriers at the surface of substrate 1. The properties of the passivation layer are configured so as to preserve the photovoltaic junction between substrate 1 and first layer 2.

In the embodiment represented in FIGS. 2 and 3, second layer 3 is obtained by doping by ion implantation of layer 5 with an opposite doping type to that of the substrate to form a p/n junction. In the case of a N-type substrate, layer 3 is therefore P-doped.

Layers 2, 3 and also consequently layer 5 preferably each have a thickness smaller than 15 nm and advantageously greater than or equal to 1 nm.

The presence of barrier layer 4 advantageously enables the thickness of doped amorphous layer 3 to be reduced, as even if the thickness of the non-doped amorphous silicon layer 5 is very small, the ion implantation will be blocked by barrier layer 4 and the dopants will not reach intrinsic amorphous silicon layer 2. The thickness of doped amorphous silicon layer 3 is, according to a preferred embodiment, less than 12 nm. A layer of small thickness advantageously enables the performances of the solar cell to be improved, for example by increasing the electric performances and significantly reducing the disturbances on passage of the charges. This advantageously enables a transparent layer to be obtained on the front side.

Amorphous silicon layers 2 and 5 are deposited by any suitable technique and for example by plasma enhanced vapor deposition (PECVD). Preferentially, amorphous silicon layers 2 and 5 are deposited at a temperature of less than 220° C., which advantageously prevents parasite crystallization processes from occurring and protects the junction of the amorphous layers. The minimum deposition temperature is ambient temperature.

Barrier layer 4 is of different nature from that of first layer 2 and second layer 3. What is meant by different nature is that the chemical composition of barrier layer 4 is different from the chemical composition of first layer 2 and from the chemical composition of second layer 3.

Barrier layer 4 is formed by a different material from that forming first layer 2.

Barrier layer 4 is preferentially formed by a different material from that forming amorphous layer 5 designed to form layer 3 after doping by ion implantation. This in particular prevents the dopants from penetrating into first amorphous layer 2.

For example, barrier layer 4 is made from a material presenting a lower diffusion rate of the implanted dopant ions than the diffusion rate of the same dopant ions in second amorphous layer 5. In this way, in the ensuing thermal budgets, the dopants are able to be sufficiently slowed down so that they do not penetrate into first amorphous layer 2.

In an alternative embodiment, the barrier layer can also be made from a material which is more difficult to pass through than that of amorphous layer 5 so as to completely stop the ion implantation. The barrier layer advantageously has a higher atomic number (Z) than that of layer 5 to be doped.

According to a particular embodiment, barrier layer 4 is semiconducting. It presents a conductivity higher than $1*10^{-6}$ S/cm. Barrier layer 4 is for example formed by a semiconductor material such as silicon carbide (SiC).

Barrier layer 4 can also be made from silicon oxide, for example from $SiO_x$ which may be doped, from silicon nitride of $SiN_x$ type which may be doped, or from metal, for example Cr, Al, Ni, or Ti. Barrier layer 4 can further be made from transparent conducting oxide (also known under the abbreviation TCO) such as Indium Tin Oxide (ITO).

The materials chosen to produce barrier layer 4 enable and/or facilitate transportation of the charge carriers necessary for operation of the solar cell, while at the same time blocking diffusion of the dopant agents when ion implantation is performed.

Preferentially, barrier layer 4 has a thickness of less than 5 nm to enable the junction between the substrate and the doped amorphous layer to be preserved. Barrier layer 4 further preferably has a thickness greater than or equal to 1 nm. This thickness range advantageously enables the surface to be correctly passivated while at the same time preventing resistive losses in the layers.

According to a preferred embodiment, barrier layer 4 has a thickness of less than 5 nm and it is semiconducting. The barrier layer therefore does not disturb transportation of the charges in the heterojunction cell.

According to another embodiment, the thickness of barrier layer 4 can be less than or equal to 5 nm.

Preferentially, barrier layer 4 is also transparent. What is meant by transparency is that barrier layer 4 lets more than 90% of an incident radiation received by the cell in the wavelength range comprised between 300 nm and 1200 nm pass through, when barrier layer 4 is arranged in the stack of thin layers formed on the front side of the substrate. For a barrier layer arranged in a stack of thin layers located on the back side of substrate 1, the wavelength range can be reduced: it can be comprised between 900 nm and 1200 nm.

Barrier layer 4 preferentially being transparent to the incident electromagnetic radiation, the solar cell enables the majority of the received photons to be converted into an electric signal without significantly modifying the efficiency of the solar cell.

According to a preferred embodiment, barrier layer 4 is formed by deposition at a temperature advantageously lower than or equal to 200° C. Preferentially, the temperature is strictly lower than 200° C. It is furthermore advantageously higher than or equal to the ambient temperature. Barrier layer 4 is for example deposited at a temperature of more than 20° C., and more particularly at a temperature comprised between 20° C. and 50° C. It is formed for example by plasma enhanced chemical vapor deposition (PECVD), physical vapor deposition (PVD), atomic layer deposition (ALD), chemical vapor deposition (CVD), evaporation or ion implantation.

The presence of barrier layer 4 between first layer 2 and second layer 3 enables the implantation profile to be better controlled by mastering the depth of diffusion of the implanted ions or by mastering the maximum implantation depth, for example of the boron or phosphorus ions. There are therefore no implanted ions in first layer 2, i.e. in the intrinsic amorphous silicon passivation layer, which enables surface recombinations in the latter layer to be considerably reduced thereby increasing the efficiency of the solar cell.

Furthermore, amorphous silicon layer 3 is more easily doped over its whole thickness and in more homogeneous manner: layer 3 is sufficiently doped to ensure a good electric field in the solar cell and the performances of the solar cell are thereby improved.

The mean ion implantation depth (Rp), during the ion implantation doping step performed after formation of the barrier layer, can be situated in the middle of layer 5 which is to be doped or at the interface between this layer 5 and barrier layer 4, in order to advantageously obtain a layer over its whole thickness. The mean ion implantation depth corresponds to the penetration of the ions into the material (range), and it depends on the nature of the materials encountered, on the nature of the ions, their energy, and so forth.

As represented in FIG. 3, the heterojunction solar cell obtained in this way successively comprises:
- a substrate 1 made from crystalline semiconductor material doped with a first doping type and provided with a first main face,
- a first layer 2 made from intrinsic amorphous semiconductor material on said first main face of the substrate.
- a second layer made from doped amorphous semiconductor material 3.

The cell further comprises a first barrier layer 4 arranged between first layer 2 and second layer 3, said barrier layer 4 being of different nature from those of the first and second layers.

Preferentially, the semiconductor material is silicon, i.e. the crystalline semiconductor material is crystalline silicon and the amorphous semiconductor material is amorphous silicon.

In the embodiment described in FIG. 3, the first main face of the substrate on which the successive stack of layers 2, 4 and 3 is arranged corresponds to the front side of the substrate. In this case, second layer 3 is doped by ion implantation with an opposite doping type to that of substrate 1 (for example P-doping for an N-doped substrate).

According to an alternative, the first main face of the substrate on which the successive stack of layers 2, 4 and 3 could be arranged could also correspond to the back side of the substrate. In this case, second layer 3 would be doped by ion implantation with doping of the same type as that of substrate 1 (a N-doping type for an N-doped substrate).

Figure 4:
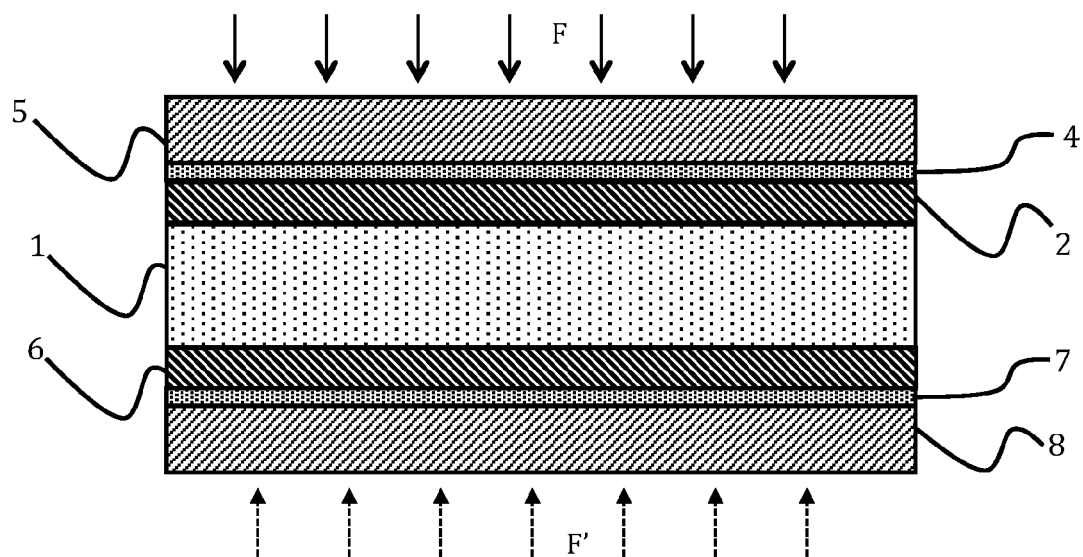

According to another particular embodiment and as represented in FIG. 4, the production method can comprise fabrication of two successive stacks of thin layers respectively on the front and back sides, with for each of them formation of a barrier layer between two layers of intrinsic amorphous silicon, before doping of the top layer by ion implantation.

The method thus comprises the following first step: providing a substrate 1 made from crystalline semiconductor material doped with a first type of doping and provided with a first main face, for example the front side, and with a second main face, for example the back side.

The method further comprises, for the front side of substrate 1, the following successive steps:
- depositing a first layer 2 of intrinsic amorphous semiconductor material on the front main face of the substrate,
- forming a second layer 5 of amorphous semiconductor material on first layer 2.

The method comprises, on the front side, deposition of a barrier layer 4 between first layer 2 and second layer 5, said barrier layer 4 being of different nature from those of first layer 2 and second layer 5.

The production method in addition comprises, for the back side of substrate 1, the following successive steps:
- depositing a third layer 6 of intrinsic amorphous semiconductor material on the back main face of the substrate,
- forming a fourth layer 8 of amorphous semiconductor material on third layer 6.

The method comprises, on the back side, deposition of a second barrier layer 7 between third layer 6 and fourth layer 8, said barrier layer 7 being of different nature from those of first layer 6 and second layer 8.

The method further comprises doping of second layer 5 and of fourth layer 8 by ion implantation (arrows F and F', respectively on the front side and on the back side of substrate 1).

Preferentially, the semiconductor material is silicon.

Preferentially, for a substrate made from N-doped crystalline silicon, ion implantation enabling P-doping to be obtained (arrows F) is performed on second layer 5 of the front side. An amorphous P-doped silicon layer 3 is thus obtained on the front side in order to form a p/n junction with substrate 1. This enables the carrier current generated in the solar cell to be retrieved.

Preferentially, on the back side, an ion implantation of N type (arrows F') is performed on fourth layer 8. An amorphous silicon layer 9 doped in the same way as the substrate, here N-doped, is thus obtained on the back side in order to form a back surface field BSF.

Figure 5:
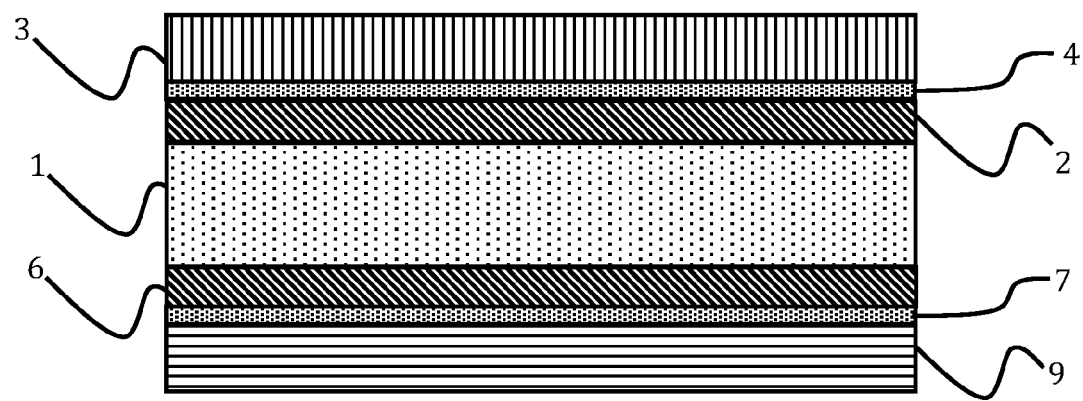

As represented in FIG. 5, the solar cell obtained in this way comprises the following successive stack, starting from the first main face of crystalline semiconductor material substrate 1, doped with a first type of doping, the first main face advantageously being the front side:
- a first layer 2 of intrinsic amorphous semiconductor material arranged on the front main face of substrate 1,
- a first barrier layer 4,
- a second layer of doped amorphous semiconductor material 3, preferably P-doped if substrate 1 is N-doped.

The second main face, i. e. the back side, of the substrate of the solar cell comprises the following stack starting from crystalline substrate 1:
- a third layer 6 of intrinsic amorphous semiconductor material arranged on the back main face of substrate 1,
- a barrier layer 7,
- a fourth layer of doped amorphous semiconductor material 9, preferably N-doped if substrate 1 is N-doped.

Second barrier layer 7 is of different nature from those of first layer 6 and second layer 9.

Figure 6:
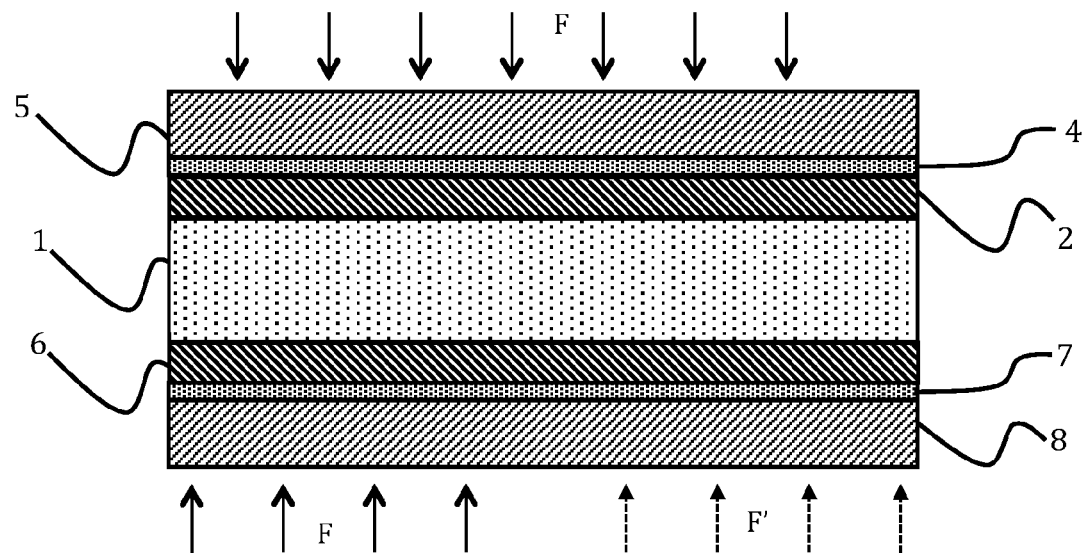

As represented in FIG. 6, according to another particular embodiment, one of amorphous layers 5 and 8 can be locally doped with different types of dopings (arrows F and F'): a doping type identical to that of the substrate and a doping type opposite from that of the substrate. This then enables two types of doping to be locally formed so as to form a first P-doped area adjacent to a second N-doped area. Preferentially, the layer doped with two different doping types is the doped amorphous layer on the back side, i.e. fourth layer 8.

Figure 7:
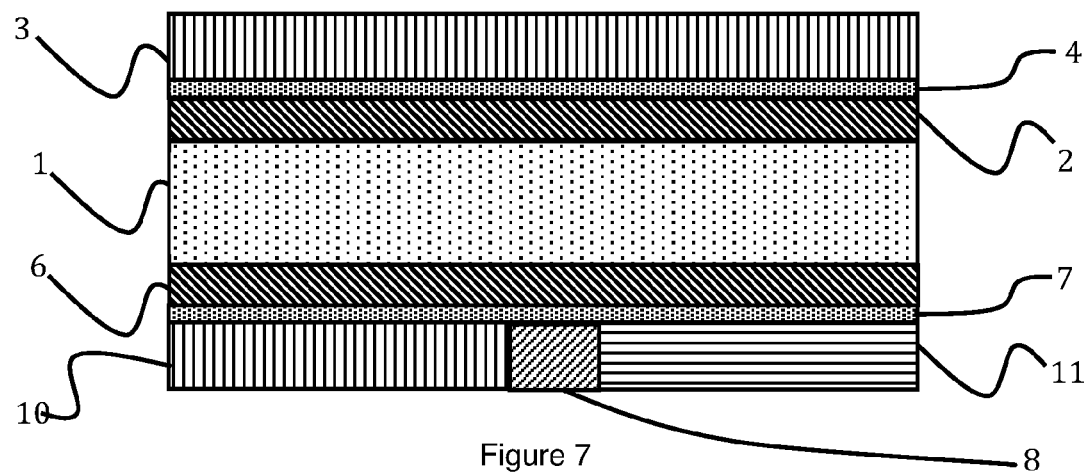

What is meant by adjacent is that the solar cell obtained in this way, as represented in FIG. 7, comprises two distinct areas, first area 10 being P-doped and second area 11 being N-doped. The two areas 10 and 11 are preferentially situated in the same plane, they can be contiguous or separated by an intermediate area, for example by an intrinsic amorphous silicon area. This can for example be formed by a part of fourth layer 8 which was not doped during the ion implantation doping step.

The use of ion implantation in the presence of a barrier layer advantageously enables this type of doping pattern to be easily achieved.

During the production steps of the solar cell, annealings may be performed for example to modify the doping profile or to stabilize the crystalline structure of the deposited and/or implanted layers.

The N-type dopings described in the foregoing are preferably achieved by doping with phosphorus and the P-type dopings are preferably achieved by doping with boron.

The embodiments described above concern a N-doped crystalline substrate.

According to another embodiment, the substrate could be a P-doped crystalline substrate. The dopings of the doped amorphous layers would then be reversed, the N-doped layers would be P-doped and the P-doped layers would be N-doped.

This production method can be used not only for heterojunction solar cells (HET), but also for rear contact heterojunction solar cells (RCC HET).

In the embodiments described in the foregoing, the heterojunction solar cell is silicon-base, i.e. substrate 1 and the stacks of successive layers 2, 3, 5, 6, 8 and 9 are silicon-base, and preferably made from silicon. However, they could also be formed by a base made from one or more other semiconductor materials such as germanium or a silicon-germanium alloy or an AsGa alloy. Furthermore, they are not necessarily all made from the same semiconductor material.

The different possibilities (variants and embodiments) are to be construed as not being exclusive from one another and can be combined with one another.

The invention claimed is:

1. A method for producing a heterojunction solar cell comprising the following successive steps:
    providing a substrate made from crystalline semiconductor material, doped with a first type of doping, and provided with a first main face,
    depositing a first layer of intrinsic amorphous semiconductor material on said first main face of the substrate,
    depositing a barrier layer on the first layer,
    forming a second layer of amorphous semiconductor material on the barrier layer, and
    doping the second layer by ion implantation,
    wherein said barrier layer is a different chemical composition from those of the first layer and second layer and acts as a barrier during the ion implantation.

2. The method according to claim 1, wherein the barrier layer is semiconducting.

3. The method according to claim 1, wherein the barrier layer is made from silicon oxide, silicon nitride, metal or a transparent conducting oxide.

4. The method according to claim 1, wherein the barrier layer has a thickness of less than 5 nm.

5. The method according to claim 1, wherein the barrier layer is transparent.

6. The method according to claim 1, wherein the barrier layer is deposited at a temperature of less than 200° C.

7. The method according to claim 1, wherein the first and second layers each have a thickness of less than 15 nm.

8. The method according to claim 1, wherein the doping step by ion implantation of the second layer locally forms two types of doping in said layer so as to form a first P-type area adjacent to a second N-doped area.

9. A method for producing a heterojunction solar cell comprising the following successive steps:
    providing a substrate made from crystalline semiconductor material, doped with a first type of doping, and provided with a first main face,
    depositing a first layer of intrinsic amorphous semiconductor material on said first main face of the substrate,
    depositing a barrier layer on the first layer, wherein the barrier layer is a semiconducting material or is made from one or more selected from the group consisting of Cr, Al, Ti, silicon oxide, silicon nitride, or silicon carbide,
    forming a second layer of amorphous semiconductor material on the barrier layer, and
    doping the second layer by ion implantation,
    wherein said barrier layer is a different chemical composition from those of the first layer and second layer and acts as a barrier during the ion implantation.

10. The method according to claim 9, wherein the silicon oxide is a doped silicon oxide and the silicon nitride is a doped silicon nitride.

* * * * *